United States Patent
Ichikawa et al.

(10) Patent No.: US 10,115,877 B2
(45) Date of Patent: Oct. 30, 2018

(54) METHOD FOR MANUFACTURING SEMICONDUCTOR DEVICE

(71) Applicant: NICHIA CORPORATION, Anan-shi, Tokushima (JP)

(72) Inventors: Masatsugu Ichikawa, Tokushima (JP); Yoshiki Inoue, Anan (JP); Yoshiyuki Aihara, Tokushima (JP); Takehito Shimatsu, Natori (JP)

(73) Assignee: NICHIA CORPORATION, Anan-Shi (JP)

( * ) Notice: Subject to any disclaimer, the term of this patent is extended or adjusted under 35 U.S.C. 154(b) by 19 days.

(21) Appl. No.: 15/466,780

(22) Filed: Mar. 22, 2017

(65) Prior Publication Data

US 2017/0279018 A1  Sep. 28, 2017

(30) Foreign Application Priority Data

Mar. 23, 2016 (JP) .................. 2016-058870

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/153* (2013.01); *H01L 33/0079* (2013.01);
(Continued)

(58) Field of Classification Search
CPC . H01L 2224/48091; H01L 2924/00011; H01L 2924/10253; H01L 2924/181;
(Continued)

(56) References Cited

U.S. PATENT DOCUMENTS 5,508,230 A * 4/1996 Anderson ........... H01L 23/3732
257/712
8,532,448 B1 * 9/2013 Andle .................. G02B 6/4298
385/32
(Continued)

FOREIGN PATENT DOCUMENTS

JP    11-008270 A    1/1999
JP    2007-134378 A    5/2007
(Continued)

OTHER PUBLICATIONS

Shimatsu et al. (2010) "Atomic diffusion bonding of wafers with thin nanocrystalline metal films", Journal of Vacuum Science & Technology B vol. 28, Issue 4, pp. 706-714.

*Primary Examiner* — Edward Chin
(74) *Attorney, Agent, or Firm* — Foley & Lardner LLP (57) ABSTRACT

A method for manufacturing a semiconductor device includes: providing a support with a semiconductor light-emitting element including a first electrode and a second electrode; providing a base including a first interconnect terminal and a second interconnect terminal; forming a first metal layer on the support to cover the first and the second electrodes; forming a second metal layer on the base to cover the first and the second interconnect terminals; arranging the first and second electrodes and the first and second interconnect terminals to respectively face each other, and providing electrical connection therebetween by atomic diffusion; and rendering electrically insulative or removing portions of the first metal layer and the second metal layer that are outside thereof defined between the first and second electrodes and the first and second interconnect terminals.

18 Claims, 7 Drawing Sheets

(51) Int. Cl.
  *H01L 33/00* (2010.01)
  *H01L 25/075* (2006.01)
  *H01L 33/44* (2010.01)

(52) U.S. Cl.
  CPC .......... *H01L 25/0753* (2013.01); *H01L 33/44* (2013.01); *H01L 2224/16225* (2013.01); *H01L 2224/8192* (2013.01); *H01L 2224/97* (2013.01); *H01L 2933/0025* (2013.01); *H01L 2933/0033* (2013.01); *H01L 2933/0066* (2013.01)

(58) Field of Classification Search
  CPC ....... H01L 2224/16; H01L 2224/81805; H01L 2924/00; H01L 2924/00012; H01L 2924/00014; H01L 33/46; H01L 33/507; H01L 33/60
  USPC ............ 257/762, E21.508, E21.576, E23.02, 257/E23.111, E23.132, E23.134, E23.167, 257/E25.02, 706, 712, 88, 89, 98, 99; 438/125, 22, 27, 28, 411, 455, 613
  See application file for complete search history.

(56) References Cited

U.S. PATENT DOCUMENTS

| | | | | |
|---|---|---|---|---|
| 2002/0042187 | A1* | 4/2002 | Trezza | H01L 25/0753 438/411 |
| 2003/0102563 | A1* | 6/2003 | Mercado | H01L 23/3171 257/762 |
| 2005/0218420 | A1* | 10/2005 | Bessho | H01S 5/02272 257/99 |
| 2013/0285248 | A1* | 10/2013 | Yin | H01L 23/49866 257/762 |
| 2015/0048390 | A1* | 2/2015 | Imazu | H01L 25/0756 257/88 |
| 2015/0137164 | A1* | 5/2015 | Ichikawa | H01L 33/005 257/98 |

FOREIGN PATENT DOCUMENTS

| | | |
|---|---|---|
| JP | 2008-066365 A | 3/2008 |
| JP | 2010-046696 A | 3/2010 |
| JP | 2011-235300 A | 11/2011 |
| JP | 2012-223792 A | 11/2012 |
| JP | 2013-251417 A | 12/2013 |

* cited by examiner

METHOD FOR MANUFACTURING SEMICONDUCTOR DEVICE

CROSS-REFERENCE TO RELATED APPLICATION

This application claims priority to Japanese Patent Application No. 2016-058870, filed on Mar. 23, 2016, the disclosure of which is hereby incorporated by reference in its entirety.

BACKGROUND

The present disclosure relates to a method for manufacturing a semiconductor device, and particularly to a method for bonding a semiconductor element on a mounting board.

A structure called "chip-on-board" for mounting a semiconductor chip on a mounting board has been put into practical use as a technique for mounting a semiconductor element such as an LED or an FET on a mounting board. For example, Japanese Laid-Open Patent Publication No. 11-008270 discloses a technique for mounting a semiconductor chip on a mounting board by flip chip bonding using bumps.

SUMMARY

In the conventional technique for mounting a semiconductor chip on a mounting board, it is necessary to provide a bump for each electrode of the semiconductor chip, thereby possibly requiring a long manufacturing time and increasing the manufacturing cost, thus lowering the productivity.

Certain embodiments of the present disclosure provide a method for manufacturing a semiconductor device, with which it is possible to mount a semiconductor chip without having to individually provide a bonding member, such as a bump, for each electrode of the semiconductor chip.

A method for manufacturing a semiconductor device of the present disclosure includes: (a) providing a support with one or more semiconductor elements arranged thereon, the one or more semiconductor elements including a first electrode and a second electrode provided on a semiconductor structure; (b) providing a base including a first interconnect terminal corresponding to the first electrode, and a second interconnect terminal corresponding to the second electrode; (c) forming a first metal layer on the support so as to continuously cover a surface of the first electrode and a surface of the second electrode; (d) forming a second metal layer on the base to continuously cover a surface of the first interconnect terminal and a surface of the second interconnect terminal; (e) arranging the first electrode and the first interconnect terminal so as to face each other and arranging the second electrode and the second interconnect terminal so as to face each other, and providing electrical connection between the first electrode and the first interconnect terminal as well as between the second electrode and the second interconnect terminal, by atomic diffusion bonding; and (f) rendering electrically insulative or removing a third portion defined between the first metal layer and the second metal layer that is outside a first portion thereof defined between the first electrode and the first interconnect terminal and is outside a second portion thereof defined between the second electrode and the second interconnect terminal.

According to the method for manufacturing a semiconductor device of the present disclosure, there is no need to individually form a bonding member, such as a bump, for each electrode of a semiconductor element, resulting in a good productivity.

DETAILED DESCRIPTION OF EMBODIMENTS

The present inventor arrived at using atomic diffusion bonding or surface activated joining as a method for electrically joining a semiconductor element to a base on which interconnect terminals are provided. With these joining methods, members can be joined together by forming a metal layer on each of the members to be joined and bringing the metal layers into contact with each other or by activating the surface of each of the members to be joined and bringing the surfaces into contact with each other. Therefore, an electrode and an interconnect terminal can be electrically connected to each other by a simple method without having to provide a bonding member for each electrode and interconnect terminal. Metal layers formed between electrodes and between interconnect terminals, however, may result in short-circuiting without any treatment. In view of this, according to the present embodiment, after an electrode and an interconnect terminal are joined together, a predetermined portion of the metal layer is insulated or removed so as to prevent short-circuiting. As a result, it is possible to manufacture semiconductor devices with a high productivity.

Methods for manufacturing a semiconductor device according to the first to fourth embodiments will now be described with reference to the drawings. The following embodiments are illustrative, and the claimed invention is not limited by these embodiments. In the following description of the embodiments, like elements are denoted by like reference numerals throughout the various embodiments, for ease of understanding and for avoiding redundant descriptions.

First Embodiment

Figure 1:
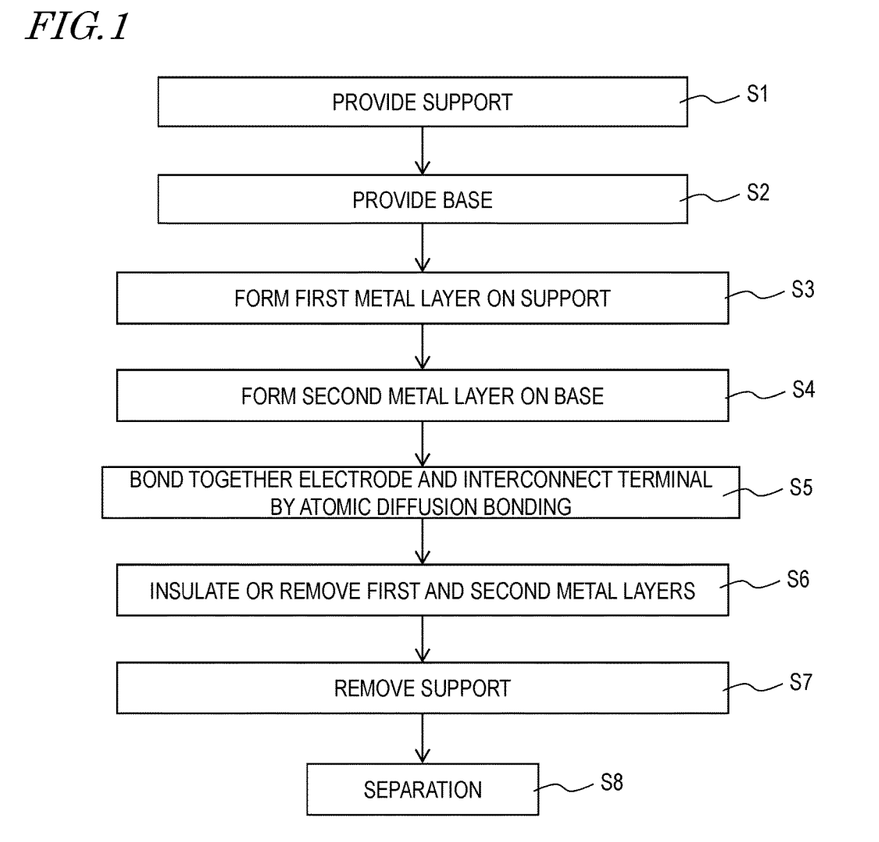
FIG. 1 is a flow chart showing a method for manufacturing a semiconductor device according to first and second embodiments.

A method for manufacturing a semiconductor device according to the first embodiment will be described. FIG. 1 is a flow chart showing a method for manufacturing a semiconductor device of the present embodiment. FIG. 3 shows schematic cross-sectional views showing cross sections of different steps of the method for manufacturing a semiconductor device of the present embodiment.

Providing Support (S1, Step (a))

A support 101 with semiconductor elements 1 arranged thereon is provided. The support 101 supports one or more semiconductor elements 1. The support 101 is preferably a rigid plate-shaped member, for example, a ceramic, glass, metal or plastic material. The size of the support 101 is preferably such that a first metal layer 102 and a second metal layer 202 can be formed with a uniform thickness in subsequent steps. When a plurality of semiconductor elements 1 are to be arranged together and then singulated into individual pieces, the size of the support 101 can be determined based on the number of semiconductor devices to be formed at once. The semiconductor elements 1 are arranged on the support 101 in a one-dimensional or two-dimensional arrangement with a predetermined interval therebetween.

The semiconductor elements 1 are arranged on a main surface 101a of the support 101 using an adhesive agent or an adhesive sheet. When the support 101 is to be eventually removed from each semiconductor element 1, one may use an adhesive sheet or an adhesive agent having such a degree of adhesiveness that the support 101 can be peeled off the semiconductor element 1.

Figure 2:
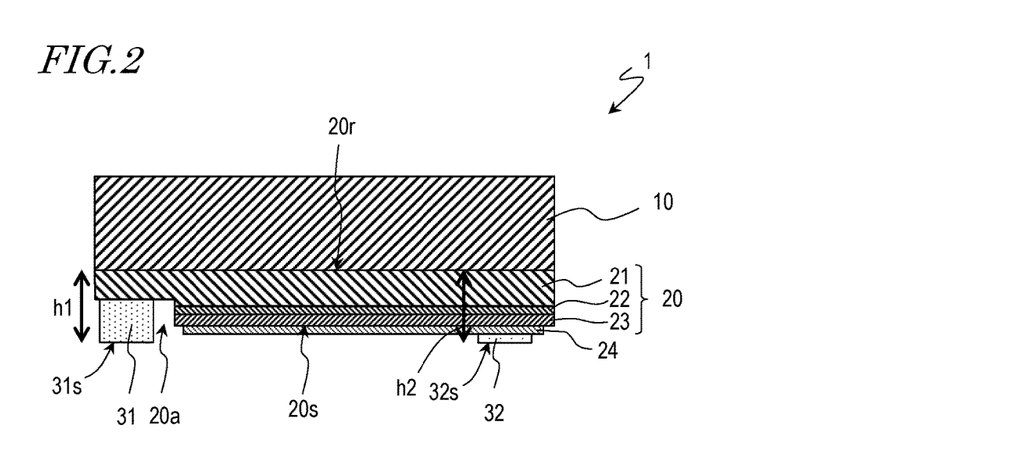
FIG. 2 is a schematic cross-sectional view showing a semiconductor element that can be used in embodiments of the present disclosure.

The semiconductor element 1 may be a light-emitting diode (LED), which is a semiconductor light-emitting element. The semiconductor element 1 includes a substrate 10, a semiconductor structure 20, one or more first electrodes 31 and one or more second electrodes 32, as shown in FIG. 2. The semiconductor structure 20, having a first main surface 20s and a second main surface 20r, which face in opposite directions from each other, are in contact with the substrate 10 at the second main surface, and the first electrodes 31 and the second electrodes 32 are located on a surface of the first main surface 20s side, which is on the opposite side from the second main surface 20r. In the present embodiment, the semiconductor elements 1 are flip-chip-mounted, and light from the semiconductor structure 20 is extracted primarily from the second main surface 20r.

The substrate 10 may be formed from a material such that the semiconductor structure 20 can be epitaxially grown. When the semiconductor structure 20 is made of a nitride semiconductor, for example, the substrate 10 may be a sapphire substrate. The substrate 10 may be removed after the semiconductor structure 20 is formed. The substrate 10 is transparent to wavelengths of light emitted from the semiconductor structure 20.

The semiconductor structure 20 includes an n-side semiconductor layer 21, a p-side semiconductor layer 23, and an active layer 22 positioned between the n-side semiconductor layer 21 and the p-side semiconductor layer 23, for example. The n-side semiconductor layer 21 is located between the substrate 10 and the active layer 22. A gap portion 20a, where the p-side semiconductor layer 23 is absent and the n-side semiconductor layer 21 is exposed on the bottom, is provided in a part of the semiconductor structure 20 on the substrate 10.

In the present embodiment, each of the second electrodes 32 is electrically connected to each of the p-side semiconductor layers 23 via a full-surface electrode 24. The full-surface electrode 24 is a diffusion electrode for directing a current flow into the p-side semiconductor layer 23 after diffusing a current flow from the second electrode 32 over a wider area. For the full-surface electrode 24, Ag, ITO or ZnO may be used, for example. The first electrode 31 is located in the gap portion 20a to be in contact with the n-side semiconductor layer 21, and is electrically connected to the n-side semiconductor layer 21.

The first electrode 31 and the second electrode 32 may comprise, for example, a metal material such as gold, copper, nickel, titanium and platinum, a single layer of an alloy thereof, or a multi-layer film thereof.

As indicated by arrows in FIG. 2, a height h1 from the second main surface 20r of the semiconductor structure 20 to a surface 31s of the first electrode 31 is equal to a height h2 from the second main surface 20r of the semiconductor structure 20 to a surface 32s of the second electrode 32. Then, when the semiconductor element 1 is joined, an equal force is applied on the first electrode 31 and on the second electrode 32, so that even and uniform joining is realized on the first electrode 31 side and on the second electrode 32 side.

The semiconductor element may be another semiconductor light-emitting element such as an laser diode (LD), or a transistor having various structures that functions as an amplification element or a switching element.

Providing Base (S2, Step(b))

Figure 3A:
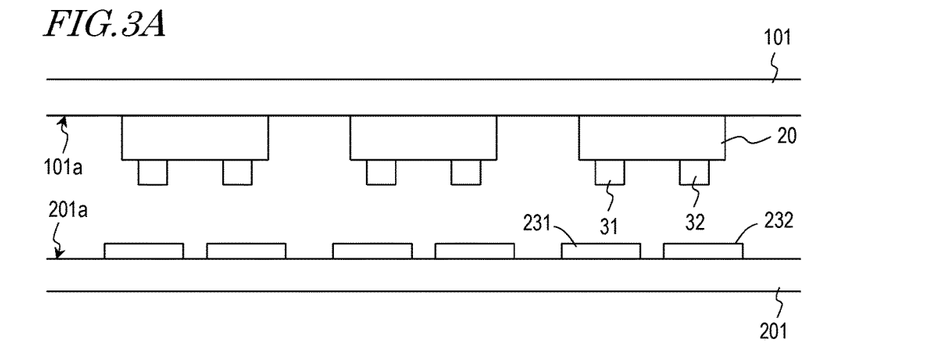
FIG. 3A to FIG. 3D are schematic cross-sectional views showing cross sections of different steps of a method for manufacturing a semiconductor device according to the first embodiment.

A base 201 including one or more first interconnect terminals 231 and one or more second interconnect terminals 232, as shown in FIG. 3A, is provided. The base 201 may be a plate-shaped member made of a material such as aluminum nitride, aluminum oxide, or the like, for example.

The first interconnect terminals 231 and the second interconnect terminals 232 are provided on a main surface 201a of the base 201. The first interconnect terminals 231 and the second interconnect terminals 232 are provided at positions that respectively correspond to one or more of the first electrodes 31 and one or more of the second electrodes 32 of one or more of the semiconductor elements 1 on the support 101. The first interconnect terminals 231 and the second interconnect terminals 232 are made of a material such as gold, silver, copper, aluminum, nickel and titanium. For example, the first interconnect terminals 231 and the second interconnect terminals 232 can be produced by forming a metal layer across the entirety of the main surface 201a of the base 201 using a thin film formation technique such as vacuum deposition or sputtering and then patterning the metal layer using a patterning technique such as photolithography.

Forming First Metal Layer (S3, Step (c))

Figure 3B:
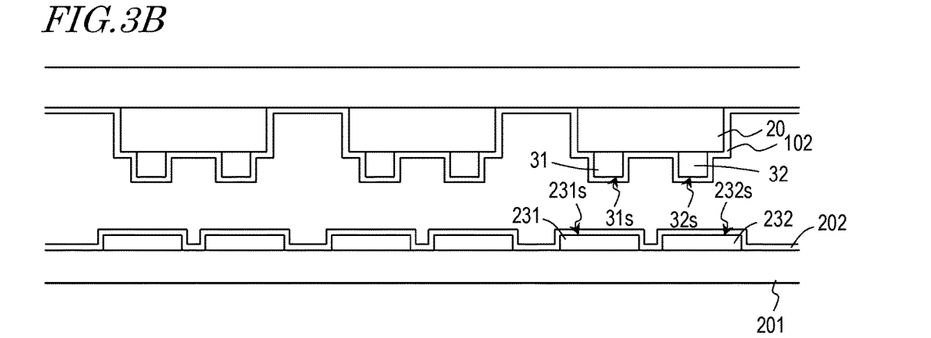

As shown in FIG. 3B, the first metal layer 102 is formed on the main surface 101a of the support 101 to continuously cover the surfaces 31s of the first electrodes 31 and the surfaces 32s of the second electrodes 32. The first metal layer 102 and the second metal layer 202, described in a subsequent step, are to be the medium for electrical and mechanical joining between each of the first electrodes 31 and each of the first interconnect terminals 231 and between each of the second electrodes 32 and each of the second interconnect terminals 232 through atomic diffusion joining.

The first metal layer 102 preferably comprises a metal selected from the group consisting of aluminum, gold, titanium, tantalum, zirconium, niobium, vanadium, hafnium, tungsten, gallium and indium, or an alloy whose primary component is one of these metals. In view of the ease of atomic diffusion joining, the first metal layer 102 preferably comprises a metal selected from the group consisting of titanium, zirconium, aluminum, gallium and indium, which have relatively high diffusion coefficients, or an alloy whose primary component is one of these metals. In view of realizing a high adhesion strength at the interface with the substance over which the metal layer is formed, the first metal layer 102 preferably comprises a metal selected from the group consisting of titanium, tantalum, zirconium, niobium, vanadium, hafnium and tungsten, or an alloy whose primary component is one of these metals. When the first metal layer 102 is to be oxidized for insulation in step S6 to be described later, the first metal layer 102 preferably comprises a metal selected from the group consisting of titanium, tantalum, zirconium, aluminum, niobium, vanadium, hafnium, tungsten, gallium and indium, or an alloy whose primary component is one of these metals, because an oxide of these metals has a large absolute value of standard free energy of formation and these metals can be easily oxidized. It is more preferred to use titanium and zirconium, which have all the properties mentioned above. When the first metal layer 102 is to be removed in step S6, it is preferred to use gold, which is less easily oxidized. The first metal layer 102 may have a layered structure. For example, when the support 101 is of a ceramic material, a metal layer made of tantalum having a high adhesion strength may be formed on the main surface 101a of the support 101, and titanium, which has a good joining property for atomic diffusion joining and which is easily oxidized, may be formed on the tantalum metal layer. Then, it is possible to stably realize joining having a higher joining strength for atomic diffusion joining.

The first metal layer 102 can be formed by using a sputtering apparatus, a vacuum deposition apparatus, or the like.

When the adhesion strength of the first metal layer 102 to the surfaces 31s of the first electrodes 31 and to the surfaces 32s of the second electrodes 32 is weak, the first metal layer 102 may come off the surfaces 31s of the first electrodes 31 and the surfaces 32s of the second electrodes 32 after the semiconductor elements 1 are mounted on the base 201. In view of this, the oxide or other substances of the surfaces 31s of the first electrodes 31 and the surfaces 32s of the second electrodes 32 may be removed through acid wash, as necessary, before the formation of the first metal layer 102.

The thickness of the first metal layer 102 is preferably 0.05 nm or more and 50 nm or less, and more preferably 0.05 nm or more and 1 nm or less. If the first metal layer 102 has a predetermined film thickness or more, the joining is made easier by atomic diffusion joining, and in case of the predetermined film thickness or less, oxidization and removal can be done more easily. The thickness of the first metal layer 102 may be controlled and determined based on the deposition rate. Specifically, the film formation time A and the film thickness B are measured to obtain the deposition rate B/A in advance, within a range where the thickness of the film formed can be measured accurately. If the first metal layer 102 is formed under the same conditions, the film formation time A' and the deposition rate B/A can be used to obtain the thickness of the film to be formed (B/A*A').

[Forming Second Metal Layer (S4, Step (d))]

As shown in FIG. 3B, the second metal layer 202 is formed on the main surface 201a of the base 201 to continuously cover surfaces 231s of the first interconnect terminals 231 and surfaces 232s of the second interconnect terminals 232. The material, the thickness and the method of formation, and other conditions of the second metal layer 202 may be the same as those of the first metal layer 102. Using the same material for the first metal layer 102 and for the second metal layer 202 facilitates joining by atomic diffusion joining. The material of the first metal layer 102 and the material of the second metal layer 202 may be different from each other.

As for the order of forming the first metal layer 102 and the second metal layer 202, the first metal layer 102 can be formed first or the second metal layer 202 can be formed first. When the first metal layer 102 and the second metal layer 202 are formed of the same metal, it is preferred to simultaneously form the first metal layer 102 and the second metal layer 202.

Connecting First Electrode to First Interconnect Terminal and Second Electrode to Second Interconnect Terminal (S5, Step (e))

By atomic diffusion joining, each of the first electrodes 31 is electrically connected to each of the first interconnect terminals 231, and each of the second electrodes 32 is electrically connected to each of the second interconnect terminals 232.

Atomic diffusion joining is a joining technique in which a metal layer is formed on the surface of each of two members to be joined together, and the surfaces are brought into contact with each other to allow the metals to diffuse into each other, thereby joining the two members together. As compared with surface activated joining used in the third and fourth embodiments to be described later, atomic diffusion joining, which uses the diffusion energy of a metal, allows for joining with a smaller load and with less damage caused by plasma. Atomic diffusion joining is disclosed in, for example, Japanese Laid-Open Patent Publication No. 2010-46696, Japanese Laid-Open Patent Publication No. 2011-235300, Japanese Laid-Open Patent Publication No. 2012-223792 and a non-patent document of T. Shimatsu, M. Uomoto, "Atomic diffusion joining of wafers with thin nanocrystalline metal films", Journal of Vacuum Science & Technology B Volume 28, Issue 4, p. 706, 2010.

Figure 3C:
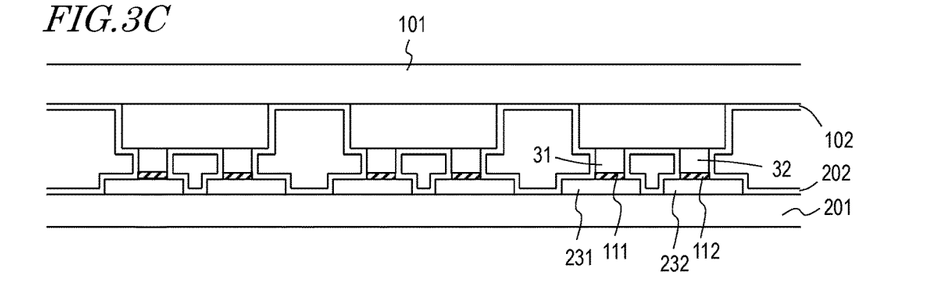

As shown in FIG. 3C, the first metal layer 102 and the second metal layer 202 are brought into contact with each other, with each of the first electrodes 31 and each of the first interconnect terminals 231 facing each other and each of the second electrodes 32 and each of the second interconnect terminals 232 facing each other. This allows the metal of the first metal layer 102 and the metal of the second metal layer 202 to diffuse into each other, thereby joining the layers together, in at least a first portion 111 formed by the first metal layer 102 and the second metal layer 202 at a region located between each of the first electrodes 31 and each of the first interconnect terminals 231, as well as in at least a second portion 112 formed by the first metal layer 102 and the second metal layer 202 at a region located between each of the second electrodes 32 and each of the second interconnect terminals 232. Accordingly, electrical connection and mechanical joining can be realized between the first electrodes 31 and the first interconnect terminals 231, and between the second electrodes 32 and the second interconnect terminals 232. With atomic diffusion joining, members can be joined together without using a bonding member such as an Au—Sn eutectic solder. The first portion 111 is located in a portion where each of the first electrodes 31 and each of the first interconnect terminals 231 are physically connected via the first metal layer 102 and the second metal layer 202. The second portion 112 is located in a portion where each of the second electrodes 32 and each of the second interconnect terminals 232 are physically connected via the first metal layer 102 and the second metal layer 202.

When the first metal layer 102 and the second metal layer 202 are made of a metal that is easily oxidized, the metal of the first metal layer 102 and the second metal layer 202 may be joined together in a vacuum, in an inert atmosphere, or in an apparatus in which the first metal layer 102 and the second metal layer 202 have been formed. When the first metal layer 102 and the second metal layer 202 are made of a metal that is not easily oxidized, this step may be performed in atmospheric air.

As shown in FIG. 3C, the first metal layer 102 and the second metal layer 202 are not in contact with each other in areas other than the first portions 111 and the second portions 112. Therefore, in the other areas, the first metal layer 102 and the second metal layer 202 are not joined together.

Insulating or Removing First Metal Layer and Second Metal Layer (S6, Step (f))

Portions of the first metal layer 102 and the second metal layer 202 that are outside the first portions 111 and the second portions 112 are rendered electrically insulative or removed.

Figure 3D:
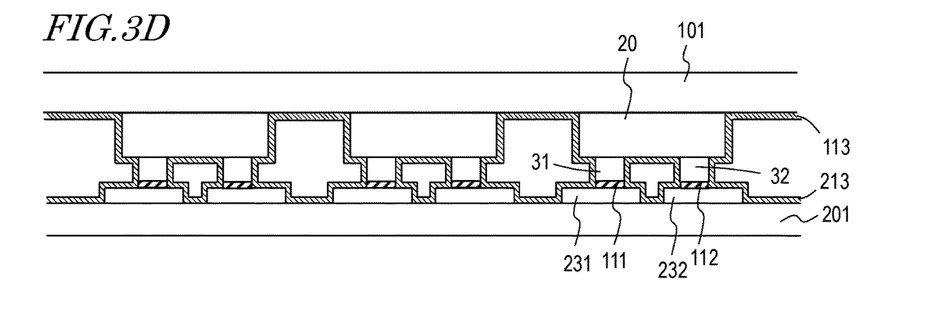

For example, as shown in FIG. 3D, the entire base 201 and the entire support 101 are exposed to an oxygen gas atmosphere, an air atmosphere, or a water vapor atmosphere, thereby oxidizing and insulating third portions 113 and 213, which are portions formed by the first metal layer 102 and the second metal layer 202 in a region other than the first portions 111 and the second portions 112. When the base 201 contains oxygen therein, oxygen may be allowed to be dissociated from the base 201, thereby oxidizing and insulating the first metal layer 102 and the second metal layer 202. This insulates the third portions 113 and 213 outside the first portion 111 and the second portion 112, thus providing electrical insulation between the first electrodes 31 and the second electrodes 32 and between the first interconnect terminals 231 and the second interconnect terminals 232. The entire base 201 and the entire support 101 may be heated in order to promote oxidization.

The metal oxide obtained by oxidizing the first metal layer 102 and the second metal layer 202 is insulative and is transparent to visible light in many cases. Moreover, the metal oxide functions as a protection film. As described above, the first metal layer 102 is formed in such a manner as to cover substantially the entire surface of the support 101, and the second metal layer 202 is formed in such a manner as to cover substantially the entire surface of the base 201, and the third portions 113 and 213 formed by the first metal layer 102 and the second metal layer 202 in a region other than the first portions 111 and the second portions 112 are turned into a metal oxide. That is, the third portions 113 and 213 are entirely turned into a metal oxide, outside the areas where electrical connection is needed between the support 101 and the base 201.

Figure 4:
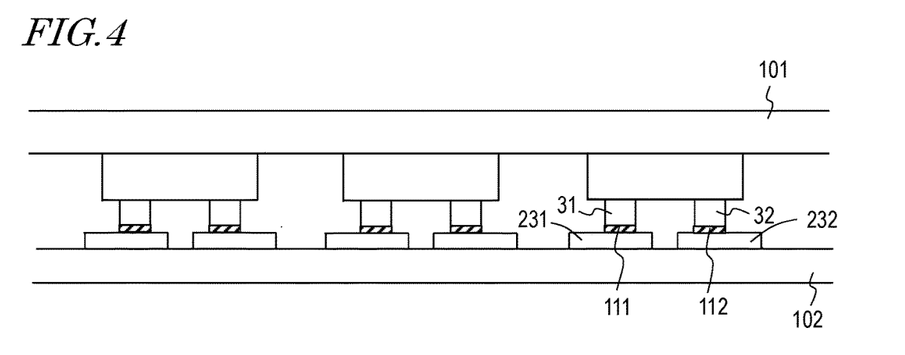
FIG. 4 is a schematic cross-sectional view showing a cross section in a step of the method for manufacturing a semiconductor device according to the first embodiment.

Although the first metal layer 102 and the second metal layer 202 are insulated through oxidization, portions of the first metal layer 102 and the second metal layer 202 that are outside the first portions 111 and the second portions 112 may be removed through wet etching or other technique. Specifically, the entire base 201 with the support 101 joined thereon is immersed in an acidic liquid. Then, portions of the first metal layer 102 and the second metal layer 202 that are outside the first portions 111 and the second portions 112 are removed, as shown in FIG. 4.

Removing Support (S7)

Figure 5:
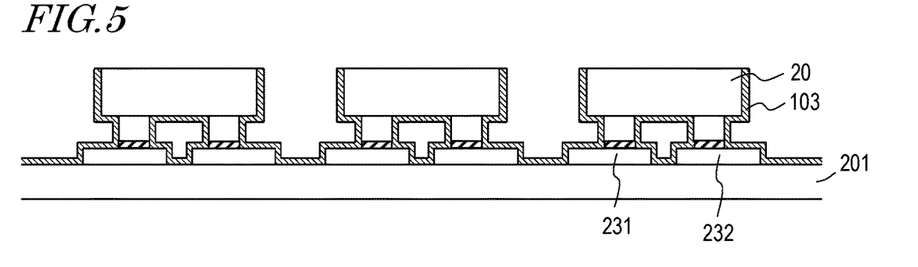
FIG. 5 is a schematic cross-sectional view showing a cross section in a step of the method for manufacturing a semiconductor device according to the first embodiment.

When the support 101 is not necessary, the support 101 is peeled off, as shown in FIG. 5.

Separation (S8)

Figure 6A:
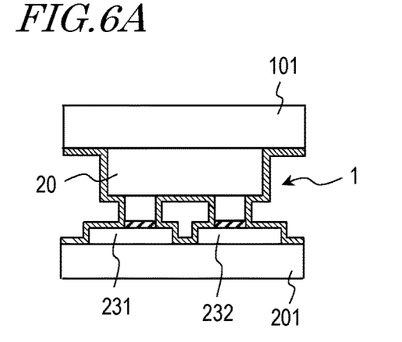
FIG. 6A and FIG. 6B are schematic cross-sectional views showing a semiconductor device manufactured by the manufacturing method of the first embodiment.
Figure 6B:
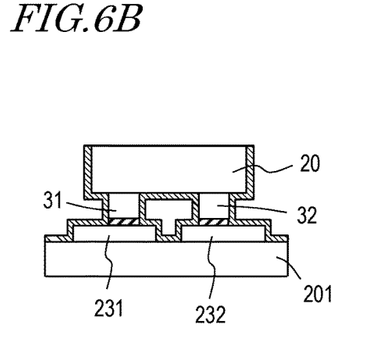

In the case where the semiconductor elements 1 are separated for use as semiconductor devices, dicing or another technique is used to separate the semiconductor elements 1 from one another. Thus, the first electrode 31 and the second electrode 32 are respectively connected to the first interconnect terminal 231 and the second interconnect terminal 232 of the base 201, as shown in FIG. 6A or FIG. 6B, producing a semiconductor device with the semiconductor element 1 mounted thereon.

With the method for manufacturing a semiconductor device of the present embodiment, in order to mount the semiconductor elements 1 on the base 201, there is no need to individually form a bonding member, such as an Au—Sn eutectic solder, for each of a plurality of electrodes of the semiconductor element 1, resulting in a good productivity.

Second Embodiment

FIG. 7 shows schematic cross-sectional views showing cross sections of different steps of the method for manufacturing a semiconductor device of the present embodiment. The method for manufacturing a semiconductor device of the second embodiment is different from the manufacturing method of the first embodiment in that first and second insulating layers 151 and 152 are respectively formed on the support 101 and the base 201. Referring to FIG. 1 and FIG. 7, the method for manufacturing a semiconductor device according to the second embodiment will be described.

Providing Support (S1)

Figure 7A:
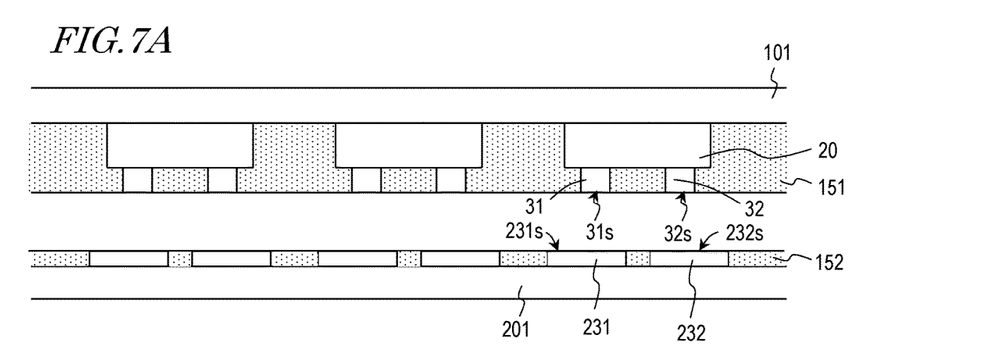
FIG. 7A to FIG. 7D are schematic cross-sectional views showing cross sections of different steps of a method for manufacturing a semiconductor device according to the second embodiment.

First, as in the first embodiment, the semiconductor elements 1 are arranged on the support 101. As shown in FIG. 7A, the first insulating layer 151 is formed on the support 101 such that the surface 31s of each of the first electrodes 31 and the surfaces 32s of each of the second electrodes 32 are exposed. Thus, the semiconductor elements 1 are embedded in the first insulating layer 151, with only the surface 31s of each of the first electrodes 31 and the surface 32s of each of the second electrodes 32 being exposed on the first insulating layer 151. Then, it is preferred that the surface of the first insulating layer 151 is substantially flush with the surface 31s of each of the first electrodes 31 and the surface 32s of each of the second electrodes 32. As used herein, "substantially flush" means that a tolerance between the height from the surface of the support 101 to the surface of the first insulating layer 151 and the height from the surface of the support 101 to the surface 31s of the first electrode 31 and the surface 32s of the second electrode 32 is 10 nm or less. Accordingly, in a subsequent step, the first metal layer 102 can be formed on a substantially flush surface. The method for forming the surfaces 31s of the first electrodes 31, the surfaces 32s of the second electrodes 32 and the first insulating layer 151 to be flush with one another may include, for example, forming the first insulating layer 151 on the support 101 to cover the first electrodes 31 and the second electrodes 32, and then trimming the first insulating layer 151 until the surfaces 31s of the first electrodes 31 and the surfaces 32s of the second electrodes 32 are exposed on the surface of the first insulating layer 151, for example, by polishing.

The first insulating layer 151 can comprise, for example, a dielectric material such as $SiO_2$, SiN, SiON, $Al_2O_3$ or AlN, or a resin material such as a silicone resin, a fluoride resin, a polyimide resin, an acrylic resin or an epoxy resin. A silicone resin is preferred because it has a high light resistance and a low refractive index among various resin materials. The first insulating layer 151 may contain a filler or other materials in order to improve the heat dissipation property and the light reflectivity.

Providing Base (S2, Step (b))

As shown in FIG. 7A, the first interconnect terminals 231 and the second interconnect terminals 232 are formed on the base 201, in the same manner as the first embodiment. Moreover, the second insulating layer 152 is formed on the base 201 such that the surfaces 231s of the first interconnect terminals 231 and the surfaces 232s of the second interconnect terminals 232 are exposed. It is preferred that the surfaces 231s of the first interconnect terminals 231, the surfaces 232s of the second interconnect terminals 232 and surface of the second insulating layer 152 are substantially flush with one another. As used herein, "substantially flush" means that a tolerance between a height from the surface of the base 201 to the surface of the second insulating layer 152 and a height from the surface of the base 201 to each of the surfaces 231s of the first interconnect terminals 231 and each of the surfaces 232s of the second interconnect terminals 232 is 10 nm or less. The method for forming the second insulating layer 152 in such a manner may be a method that is similar to the above-described method of polishing the first insulating layer 151, and the second metal layer 202 may be formed on a substantially flush surface in a subsequent step. The second insulating layer 152 can be formed from a material similar to that of the first insulating layer 151.

Forming First Metal Layer (S3, Step (c))

Figure 7B:
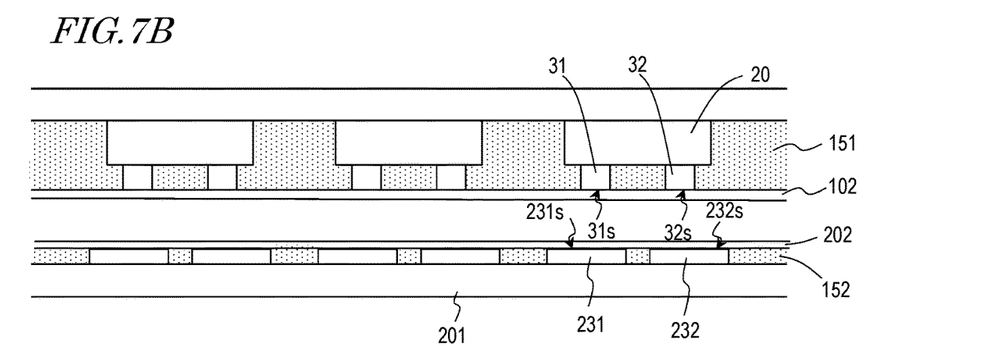

The first metal layer 102 is formed in a manner similar to that of the first embodiment. At this point, the semiconductor elements 1 are embedded in the first insulating layer 151. Therefore, the first metal layer 102 is formed to continuously cover the surfaces 31s of the first electrodes 31 and the surfaces 32s of the second electrodes 32 and the surface of the first insulating layer 151, as shown in FIG. 7B.

Forming Second Metal Layer (S4, Step (d))

The second metal layer 202 is formed in a manner similar to that of the first embodiment. The first interconnect terminals 231 and the second interconnect terminals 232 are embedded in the second insulating layer 152. Therefore, the second metal layer 202 is formed to continuously cover the surfaces 231s of the first interconnect terminals 231 and the surfaces 232s of the second interconnect terminals 232 and the surfaces of the second insulating layer 152, as shown in FIG. 7B.

Joining First Electrode and Second Electrode to First Interconnect Terminal and Second Interconnect Terminal (S5, Step (e))

Figure 7C:
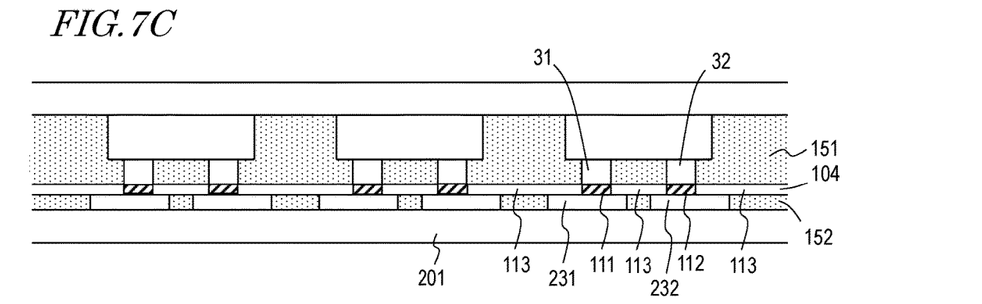

Atomic diffusion joining is used to provide electrical connection between each of the first electrodes 31 and each of the first interconnect terminals 231 and between each of the second electrodes 32 and each of the second interconnect terminals 232. When the first metal layer 102 and the second metal layer 202 are respectively formed on a planar surface on the support 101 side and a planar surface on the base 201 side as shown in FIG. 7C, the first metal layer 102 and the second metal layer 202 come into contact with each other not only in the first portions 111 and the second portions 112 but across the entire surface, and are joined together by atomic diffusion joining. Thus, the first metal layer 102 and the second metal layer 202 are joined together, thereby forming an integral third metal layer 104 including the first portions 111, the second portions 112 and the third portions 113. As the first insulating layer 151 and the second insulating layer 152 are joined together via the third metal layer 104 interposed therebetween, as described above, it is possible to improve the heat dissipation property of semiconductor devices to be obtained after the singulation step.

Insulating or Removing First Metal Layer and Second Metal Layer (S6, Step (f))

Figure 7D:
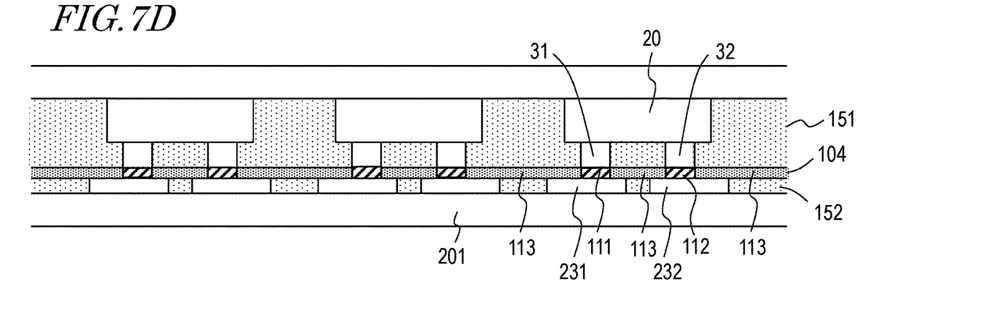

The third portions 113 of the third metal layer 104 formed in the preceding step outside the first portions 111 and the second portions 112 is in contact with the first insulating layer 151 and the second insulating layer 152. It is, therefore, believed that oxygen is diffused from the first insulating layer 151 and the second insulating layer 152 into the third portions 113 of the third metal layer 104, resulting in oxidation. Otherwise, it is believed that a metal is diffused from the third portions 113 of the third metal layer 104 into the first insulating layer 151 and the second insulating layer 152, resulting in oxidation. Otherwise, it is believed that the interatomic distance in the third portions 113 of the third metal layer 104 is increased, thereby losing the electric connection. Thus, it is believed that the third portions 113 of the third metal layer 104 is insulated and is no longer conductive.

Thereafter, the support 101 can be removed and the semiconductor elements 1 may be separated into individual pieces, as in the first embodiment.

According to the present embodiment, the semiconductor elements 1 are covered by the first insulating layer 151, and it is therefore possible to more reliably protect the semiconductor elements 1 from the ambient air, or the like, to improve the reliability of the semiconductor elements 1, and it is also possible to more efficiently dissipate heat that is generated in the semiconductor elements 1.

Although the second insulating layer 152 is provided also on the base 201 side in the present embodiment, the second insulating layer 152 may be absent. In such a case, the first metal layer 102 and the second metal layer 202 are in contact with each other only via the first portions 111 positioned between the first electrodes 31 and the first interconnect terminals 231 and via the second portions 112 positioned between the second electrodes 32 and the second interconnect terminals 232. Therefore, it is possible to insulate or remove portions of the first metal layer 102 and the second metal layer 202 that are outside the first portions 111 and the second portions 112 by a method similar to that of the first embodiment. Also in such a case, the first insulating layer 151 is provided around the semiconductor elements 1, and it is therefore possible to realize the effect of the first insulating layer described above.

Third Embodiment

Figure 8:
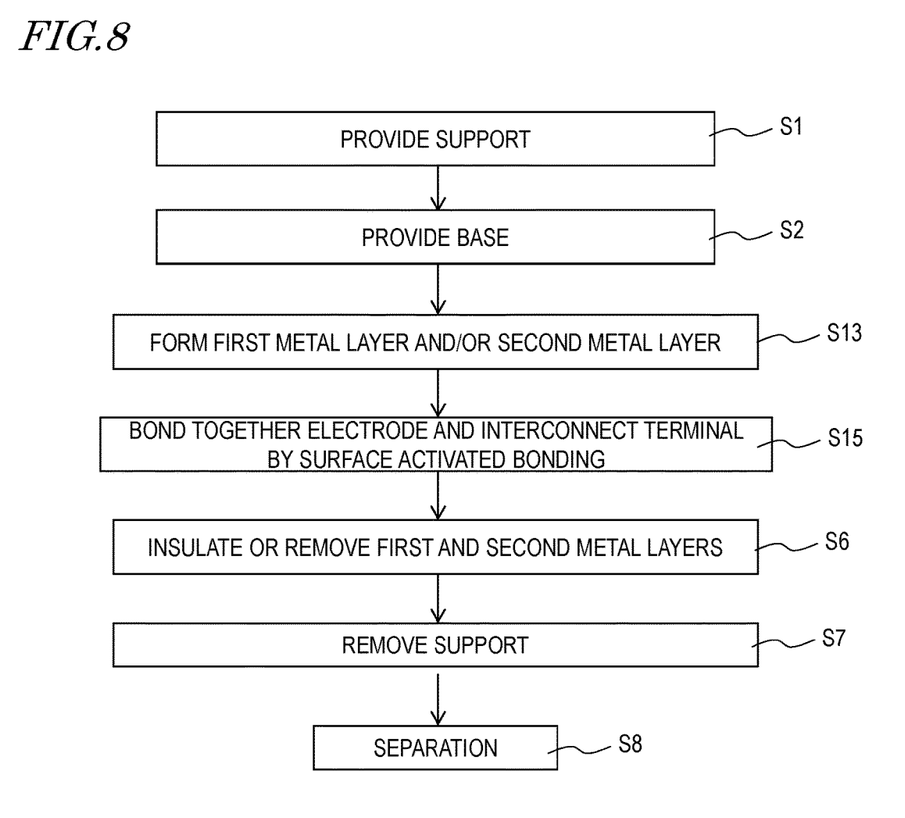
FIG. 8 is a flow chart showing a method for manufacturing a semiconductor device according to third and fourth embodiments.

FIG. 8 is a flow chart of a method for manufacturing a semiconductor device according to the present embodiment, and FIG. 9 shows schematic cross-sectional views showing cross sections of different steps of the method for manufacturing a semiconductor device according to the present embodiment. The method for manufacturing a semiconductor device of the third embodiment is different from the manufacturing method of the first embodiment in that surface activated joining is used for joining each of the first electrodes 31 to each of the first interconnect terminals 231 and each of the second electrodes 32 to each of the second interconnect terminals 232. Referring to FIG. 8 and FIG. 9, the method for manufacturing a semiconductor device according to the third embodiment will be described.

Surface activated joining is a method, in which surfaces of two members intended to be joined together, are activated, and the two members are brought into contact with each other, thereby forming an interatomic join between atoms of these members. In the present embodiment, at least one of the first metal layer 102 and the second metal layer 202, which are used in the first embodiment, is formed, and surface activation is performed on the surface of the electrodes or the interconnect terminals located on the side where the metal layer is absent. Because the activated electrodes or interconnect terminals are made of a metal, each surface of the activated electrodes or interconnect terminal are joined to the first metal layer 102 or the second metal layer 202. When both of the first metal layer 102 and the second metal layer 202 are formed, it is substantially the same as atomic diffusion joining except that the surface of one of the metal layers is activated.

Figure 9A:
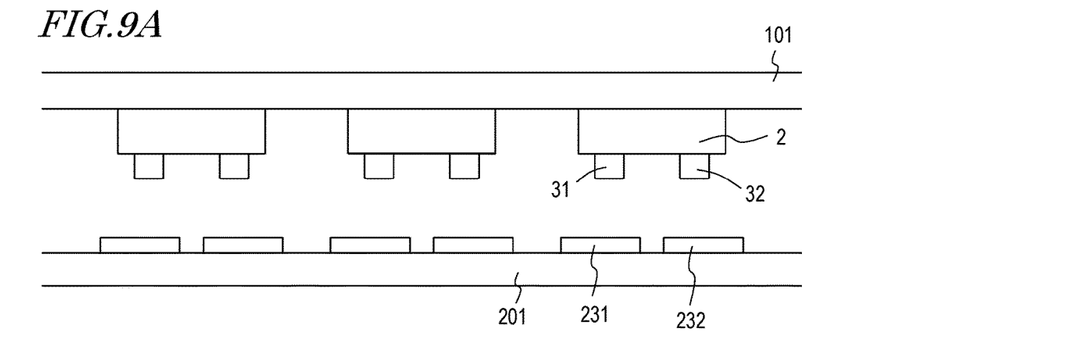
FIG. 9A to FIG. 9D are schematic cross-sectional views showing cross sections of different steps of a method for manufacturing a semiconductor device according to the third embodiment.
Figure 9B:
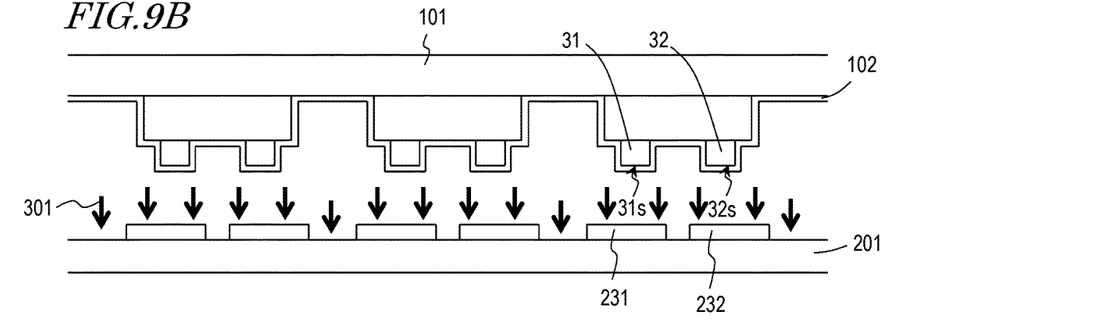

Specifically, as in the first embodiment, the support 101 and the base 201 are provided as shown in FIG. 8 and FIG. 9A (S1, S2). Then, one or both of the first metal layer 102 and the second metal layer 202 are formed (S13). In FIG. 9B, only the first metal layer 102 is formed on the support 101.

Figure 9C:
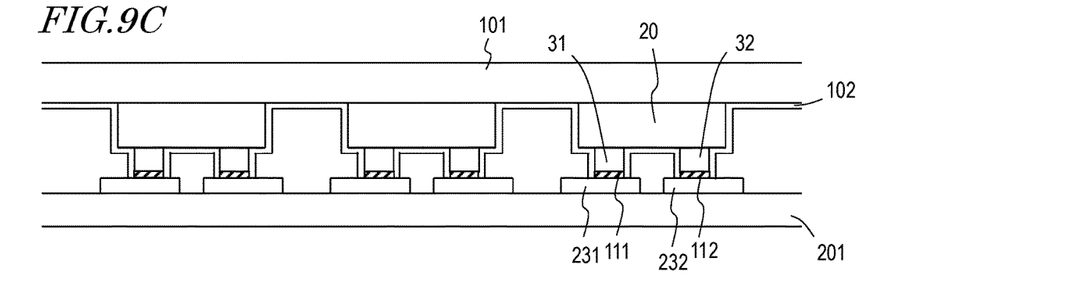

Then, the surface activation is performed on the surface of the base 201, on which the metal layer is not formed. The surface activation is done by using a sputtering apparatus or other apparatus, and by exposing the surface of the base 201 to an ion of a carrier gas such as Ar, or plasma. When it is not desirable to expose the semiconductor elements 1 to the ion or plasma 301, it is preferred that at least the first metal layer 102 is formed on the support 101, and the first interconnect terminals 231 and the second interconnect terminals 232 are activated and joined together.

Figure 9D:
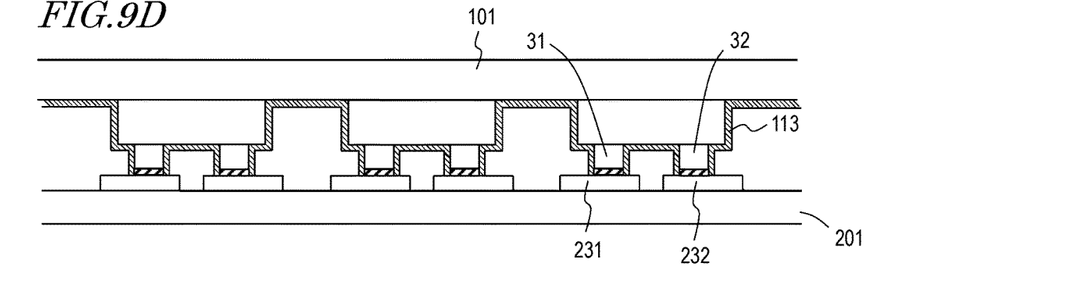

Through these steps, the surfaces 231s of the first interconnect terminals 231 and the surfaces 232s of the second interconnect terminals 232 are activated, and are brought into contact with the first metal layer 102 to be joined together. That is, in the first portions 111 and the second portions 112, the first metal layer 102 is electrically connected, and mechanically joined, to the first interconnect terminals 231 and the second interconnect terminals 232 (S15).

Thereafter, the step of insulating or removing the first metal layer 102 (S6), the step of removing the support 101 (S7), and the step of singulating the semiconductor elements 1 (S8) can be performed in a manner similar to that of the first embodiment.

Fourth Embodiment

FIG. 10 shows schematic cross-sectional views showing cross sections of different steps of the method for manufacturing a semiconductor device of the present embodiment. The method for manufacturing a semiconductor device of the fourth embodiment is different from the method for manufacturing a semiconductor device of the second embodiment in that surface activated joining is used. Referring to FIG. 8 and FIG. 10, the method for manufacturing a semiconductor device according to the fourth embodiment will be described.

Figure 10A:
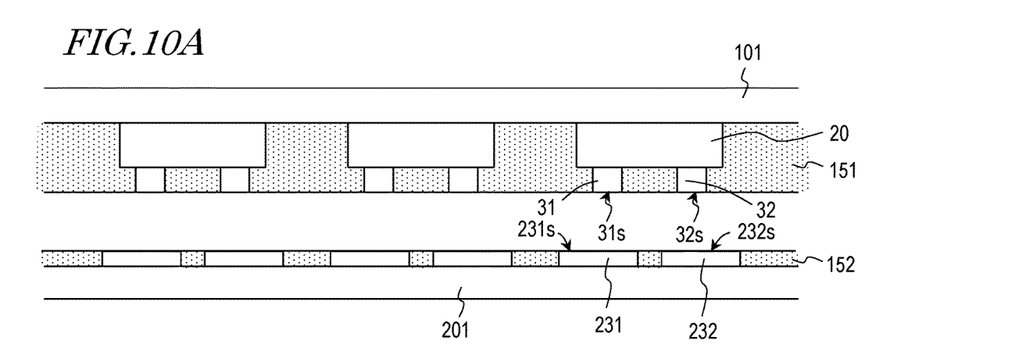
FIG. 10A to FIG. 10D are schematic cross-sectional views showing cross sections of different steps of a method for manufacturing a semiconductor device according to the fourth embodiment.
Figure 10B:
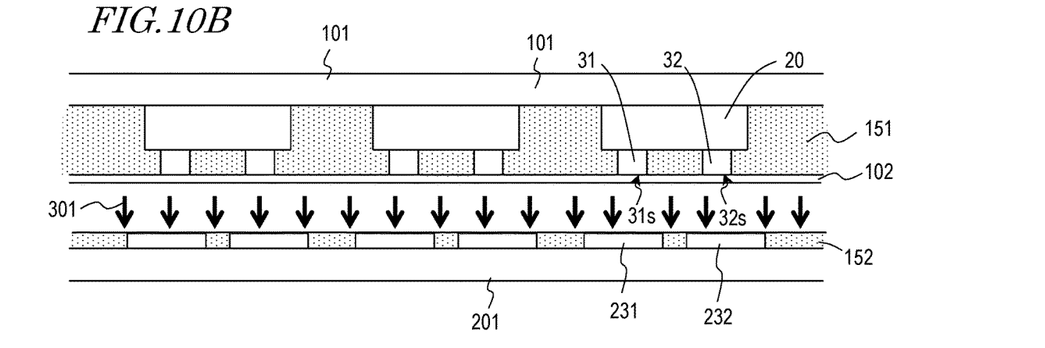

As in the second embodiment, the support 101 and the base 201 respectively having the first insulating layer 151 and the second insulating layer 152 formed thereon are provided as shown in FIG. 8 and FIG. 10A (S1, S2). Then, one or both of the first metal layer 102 and the second metal layer 202 are formed (S13). In FIG. 10B, the first metal layer 102 is formed only on the surface of the first insulating layer 151 of the support 101 and the surface of the first electrodes 31 and the surface of the second electrodes 32.

Figure 10C:
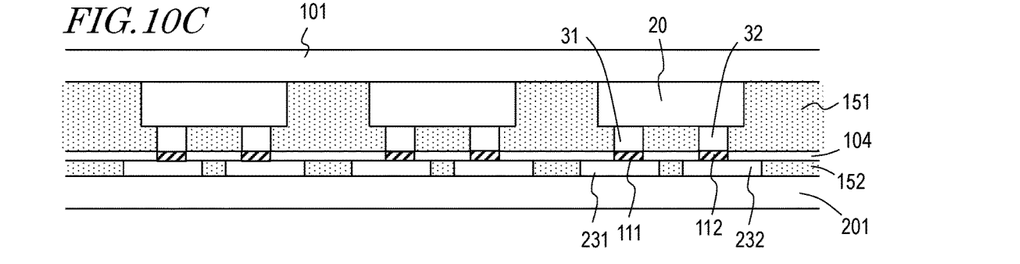

Then, the surface activation is performed on the surfaces 231s of the first interconnect terminals 231 and the surfaces 232s of the second interconnect terminals 232 provided on the base 201, on which the metal layer is absent. The surface activation in the present embodiment is done in a manner similar to that of the third embodiment.

Figure 10D:
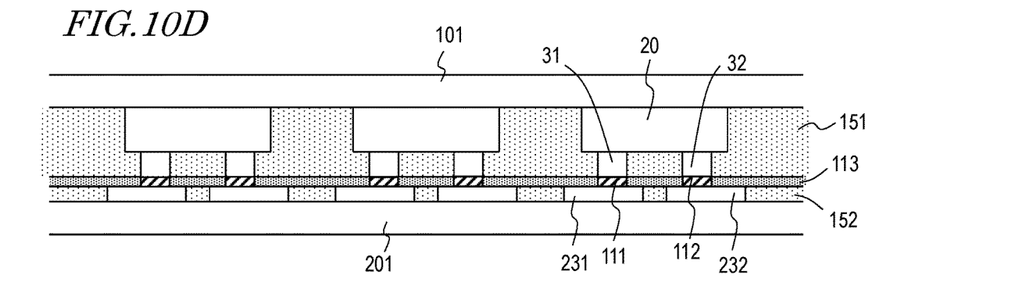

Thus, the surfaces 231s of the first interconnect terminals 231 and the surfaces 232s of the second interconnect terminals 232 are activated, and are brought into contact with the first metal layer 102 formed on the support 101 side to be joined together. As a result, in the first portions 111 and the second portions 112, the first metal layer 102 is electrically and mechanically connected to the first interconnect terminals 231 and the second interconnect terminals 232.

Thereafter, the step of insulating or removing the first metal layer 102 (S6), the step of removing the support 101 (S7), and the step of singulating the semiconductor elements 1 (S8) can be performed in a manner similar to that of the first embodiment.

The method for manufacturing a semiconductor device of the present disclosure can be suitably used for semiconductor devices of various applications using various semiconductor elements such as LEDs and FETs.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for manufacturing a semiconductor device, the method comprising:
    (a) providing a support, and a semiconductor light-emitting element disposed on the support, the semiconductor light-emitting element including:
        a semiconductor structure, and
        a first electrode and a second electrode that are disposed on the semiconductor structure;
    (b) providing a base including a first interconnect terminal corresponding to the first electrode, and a second interconnect terminal corresponding to the second electrode;
    (c) forming a first metal layer that is continuous and covers both a surface of the first electrode and a surface of the second electrode;
    (d) forming a second metal layer that is continuous and covers both a surface of the first interconnect terminal and a surface of the second interconnect terminal;
    (e) arranging the first and second electrodes to face the first and second interconnect terminals, respectively, and electrically connecting the first and second electrodes to the first and second interconnect terminals, respectively, by atomic diffusion joining, such that:
        a first portion of the first and second metal layers is in a region between the first electrode and the first interconnect terminal,
        a second portion of the first and second metal layers is in a region between the second electrode and the second interconnect terminal, and
        a third portion of the first and second metal layers is in a region other than the first and second portions; and
    (f) rendering electrically insulative or removing the third portion of the first and second metal layers.

2. The method for manufacturing a semiconductor device of claim 1, wherein:
   in step (a), a first insulating layer is disposed on the support and on portions of the semiconductor light-emitting element such that the surface of the first electrode and the surface of the second electrode are exposed from the first insulating layer, and
   step (c) includes forming the first metal layer to continuously cover the surface of the first electrode, the surface of the second electrode, and a surface of the first insulating layer.

3. The method for manufacturing a semiconductor device of claim 2, wherein:
   in step (b), a second insulating layer is disposed on the base such that the surface of the first interconnect terminal and the surface of the second interconnect terminal are exposed from the second insulating layer; and
   step (d) includes forming the second metal layer to continuously cover the surface of the first interconnect terminal, the surface of the second interconnect terminal, and a surface of the second insulating layer.

4. The method for manufacturing a semiconductor device of claim 1, wherein, in step (f), the third portion is rendered electrically insulative by oxidizing the third portion using an oxygen gas or a water vapor.

5. The method for manufacturing a semiconductor device of claim 1, wherein, in step (f) the third portion is removed.

6. The method for manufacturing a semiconductor device of claim 1, wherein, in step (a), a plurality of the semiconductor light-emitting elements are disposed on the support.

7. The method for manufacturing a semiconductor device of claim 6, further comprising, after step (f), separating the base into individual semiconductor light-emitting elements.

8. The method for manufacturing a semiconductor device of claim 1, wherein each of the first metal layer and the second metal layer is made of titanium, zirconium, or an alloy whose primary component is titanium or zirconium.

9. The method for manufacturing a semiconductor device of claim 1, wherein each of the first metal layer and the second metal layer is made of titanium and has a thickness of 5 nm or less.

10. A method for manufacturing a semiconductor device, the method comprising:
    (a) providing a support, and a semiconductor light-emitting element disposed on the support, the semiconductor light-emitting element including:
        a semiconductor structure, and
        a first electrode and a second electrode that are disposed on the semiconductor structure;
    (b) providing a base including a first interconnect terminal corresponding to the first electrode, and a second interconnect terminal corresponding to the second electrode;
    (c) forming at least one of (i) a first metal layer that is continuous and covers both a surface of the first electrode and a surface of the second electrode, and (ii) a second metal layer that is continuous and covers both a surface of the first interconnect terminal and a surface of the second interconnect terminal;
    (d) arranging the first and second electrodes to face the first and second interconnect terminals, respectively, and electrically connecting the first and second electrodes to the first and second interconnect terminals, respectively, by surface activated joining, such that:
        a first portion of said at least one of the first and second metal layers is in a region between the first electrode and the first interconnect terminal,
        a second portion of said at least one of the first and second metal layers is in a region between the second electrode and the second interconnect terminal, and
        a third portion of said at least one of the first and second metal layers is in a region other than the first and second portions; and
    (e) rendering electrically insulative or removing the third portion of said at least one of the first and second metal layers.

11. The method for manufacturing a semiconductor device of claim 10, wherein:
    in step (a), a first insulating layer is disposed on the support and on portions of the semiconductor light-emitting element such that the surface of the first electrode and the surface of the second electrode are exposed from the first insulating layer, and
    step (c) includes forming the first metal layer to continuously cover the surface of the first electrode, the surface of the second electrode, and a surface of the first insulating layer.

12. The method for manufacturing a semiconductor device of claim 11, wherein:
    in step (b), a second insulating layer is disposed on the base such that the surface of the first interconnect terminal and the surface of the second interconnect terminal are exposed from the second insulating layer; and
    step (c) includes forming the second metal layer to continuously cover the surface of the first interconnect terminal, the surface of the second interconnect terminal, and a surface of the second insulating layer.

13. The method for manufacturing a semiconductor device of claim 10, wherein, in step (e), the third portion is rendered electrically insulative by oxidizing the third portion using an oxygen gas or a water vapor.

14. The method for manufacturing a semiconductor device of claim 10, wherein, in step (e) the third portion is removed.

15. The method for manufacturing a semiconductor device of claim 10, wherein, in step (a), a plurality of the semiconductor light-emitting elements are disposed on the support.

16. The method for manufacturing a semiconductor device of claim 15, further comprising, after step (e), separating the base into individual semiconductor light-emitting elements.

17. The method for manufacturing a semiconductor device of claim 10, wherein each of said at least one of the first metal layer and the second metal layer is made of titanium, zirconium, or an alloy whose primary component is titanium or zirconium.

18. The method for manufacturing a semiconductor device of claim 10, wherein each of said at least one of the first metal layer and the second metal layer is made of titanium and has a thickness of 5 nm or less.

* * * * *